(12) United States Patent
Kang et al.

(10) Patent No.: US 6,466,882 B1
(45) Date of Patent: Oct. 15, 2002

(54) INTEGRATED SYSTEM FOR DETECTING AND REPAIRING SEMICONDUCTOR DEFECTS AND A METHOD FOR CONTROLLING THE SAME

(75) Inventors: Sin-Seob Kang, Choongcheongnam-do; Jin-Ho Choi, Kyungki-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/377,075

(22) Filed: Aug. 19, 1999

(30) Foreign Application Priority Data

Aug. 21, 1998 (KR) .............................................. 98-33993
Jan. 5, 1999 (KR) .................................................. 99-68

(51) Int. Cl.[7] .............................................. G01N 35/00
(52) U.S. Cl. ........................... 702/84; 324/537; 438/14; 438/15; 438/16; 438/17; 438/18
(58) Field of Search ............................ 702/84; 324/537, 324/770; 438/14–18, 30; 257/59, 72; 345/87

(56) References Cited

U.S. PATENT DOCUMENTS 4,902,638 A * 2/1990 Muto .......................... 257/390
5,235,272 A * 8/1993 Henley ........................ 324/537
5,285,150 A * 2/1994 Henley et al. .............. 324/73.1
5,459,410 A * 10/1995 Henley ........................ 324/537
5,764,209 A * 6/1998 Hawthorne et al. ........... 345/87

\* cited by examiner

*Primary Examiner*—John S. Hilten
*Assistant Examiner*—Hien Vo
(74) *Attorney, Agent, or Firm*—McGuireWoods LLP; Hae-Chan Park

(57) ABSTRACT

An integrated repair system for micro electronic devices, which comprises a plurality of inspectors optically or electrically inspecting panels on which predetermined patterns have been formed and stores the inspected results in electronic files with a predetermined format. A repairer coupled to a plurality of these inspectors collects the stored files and merges the files and executes a repair process as a batch at one time with reference to the merged files. A file server is coupled to the inspectors through a network, and stores the files of the inspectors and provides the file when the repairer retrieves the files. An automatic transfer device controlled by a host automatically transfers the panels between the inspectors and between the inspector and the repairer, and an automatic transfer device controller coupled to the host receives commands from the host and controls transfers of the automatic transfer device.

28 Claims, 14 Drawing Sheets

INTEGRATED SYSTEM FOR DETECTING AND REPAIRING SEMICONDUCTOR DEFECTS AND A METHOD FOR CONTROLLING THE SAME

BACKGROUND OF THE INVENTION (a) Field of the Invention

The present invention relates to an integrated system for detecting and repairing defects and a controlling method thereof. More specifically, the present invention relates to an integrated system for detecting and repairing defects and its controlling method employed for manufacturing micro electronic devices such as semiconductors or thin film transistor liquid crystal displays (TFT-LCD).

(b) Description of the Related Art

A process for manufacturing a TFT-LCD will be first described.

Referring to FIG. 1 (a), when a transparent non-conductive substrate is metallized and patterned, a gate pattern comprising a gate electrode 110 and gate line (not illustrated) is formed. Referring to FIG. 1 (b), a gate insulation film 120 comprised of $SiN_x$ is coated on the gate pattern 110, and an amorphous silicon film 130 and a doped amorphous silicon film 140 are layered and patterned on the gate insulation film 120, and active amorphous silicon layer patterns 130 and 140 are then formed. Referring to FIG. 1 (c), a source electrode 151 and a drain electrode 152 are formed on the patterned film of the doped amorphous silicon layer 140, and a data line (not illustrated) is formed on the gate insulation film 120. Referring to FIG. 1 (d), the doped amorphous silicon layer 140 is etched using the source electrode 151 and a drain electrode 152 as masks. Referring to FIGS. 1 (e) and (f), the protective film 160 comprised of $SiN_x$ is formed on the source electrode 151 and a drain electrode 152, and a contact hole C1 of the drain electrode 152 is formed through the protective film 160. A transparent conducting material such as an indium tin oxide (ITO) is then coated around the hole C1 and patterned, and thereby, forming a pixel electrode 170.

FIGS. 2 (a) and (b) are flow charts of a conventional manufacturing process as shown in FIGS. 1 (a) through (f).

In the conventional manufacturing process as shown in FIG. 2 (a), a gate pattern comprising a gate electrode and gate line is formed in Step S2. An automatic optical inspection (AOI) or an open/short test (OST) is performed by an automatic optical inspector or an open/short tester in order to inspect the gate pattern in Step S4.

The automatic optical inspector without directly touching the product irradiates light and transmits the reflected light to a sensor through a lens, and examines the product for defects by detecting differences of the light intensity. In this way, visual defects that cannot be detected by electrical inspections can be detected, solving the process reliability and contamination problems. The automatic optical inspector can detect all visual defects, including minute defects or those that cannot be seen with naked eyes on the glass surface. Examples of such defects include film residues, film strips, particles, glass chips, corrosion, spots, photoresist defects, and mask defects.

Following the formation of the gate pattern, the results of the AOI (or OST), i.e., whether or not the above mentioned defects are present, are stored in an electronic file. (Step S6) The stored data comprises coordinate values of the defect locations, as well as the type of defects detected.

This inspected panel together with the file are then transferred to a repairing process. The file is input to a repairer to be used as repair job data on the defective panel. (Step S7)

If no defect is found on the panel on which the gate pattern has been formed or if a defective panel is completely repaired, the panel is transferred to the next process.

The subsequent process is an active pattern forming process that coats an amorphous silicon layer on the gate electrode. (Step S8) Since this active pattern forming process coats nonmetals, an electrical test is not used and only the AOI can be performed. Therefore, the automatic optical inspector performs a visual inspection (Step S10), and if defects are detected, the panel and an associated data file are transferred to the repairer so that the defects can be repaired (Step S13). If no defects are found or the repair process is completed, the panel and data file are transferred to the next data pattern forming process.

After data pattern forming process that fabricates the source electrode, drain electrode and data line, defects are repeatedly examined by AOI. (Steps S15, S16 and S17). After AOI inspection, if no defect is found or if defects are completely repaired, the panel is transferred to the open/short tester to execute the OST. (Step S8)

When data lines are patterned on a TFT-LCD panel, the open/short tester provides electrical signals to each data line to detect the open or short states of each line. The open or short states of the data lines are determined from the OST results. (Step S20) If open/short states are detected, the open data line number is stored in a file, and the defective panel are transferred to the repair process along with the file.

The repairer then repairs the panel referring to the file containing the open data line number (Step S21). The repaired panel is then transferred to a pixel electrode forming process. However, if no defect is found after an OST, the panel is immediately transferred to the pixel electrode forming process.

After forming a pixel electrode (Step S24), the panel is transferred to the automatic optical inspector and is inspected or repaired in the same manner as described previously. (Steps S24–S27) However, after forming a pixel electrode, an array test is also performed, in addition to AOI.

In an array test, each TFT pixel is tested to determine that there are any electrical defects. The array test is performed in the final TFT fabrication process, where a transparent conducting material layer (such as ITO) is formed. An in process tester (IPT), one of the array testers, optically inspects for electrical defects of pixels. The IPT can assess the electrical characteristics of each TFT pixel before completing the TFT assembly. Therefore, pixel defects and line defects, can be detected at an early stage, enhancing the productivity and reducing the costs. The array tester may detect, for example, pixel defects and open or shorted lines.

After testing arrays (Step S28), when the defects are detected, this information is stored in a file and transferred together with the panel to the repair process.

Once repaired referring to the file in the repairing process (Step S31), all the manufacturing, inspection and repair processes on the TFT panel are completed.

FIG. 3 is a process line flow diagram of a TFT panel handled in the manufacturing process of FIG. 2. FIG. 3 indicates the course through which the TFT panel is transferred when all detectable defects are generated.

As shown in FIG. 3, according to the conventional TFT-LCD repairing system, if the inspection and repairing steps are performed for each process, this inspection and repair process has the drawback of taking an inordinate amount of time.

SUMMARY OF THE INVENTION

It is an object of the present invention to provide an integrated system for repair and its controlling method that merges files thathave information on defects and to repair the defects as a batch at one time referring to the merged files at a final manufacturing step after all inspections have been finished.

In one aspect of the present invention, an integrated repair system of micro electronic devices comprises a plurality of inspectors for optically or electrically inspecting panels that have predetermined patterns after finishing each process, and storing the inspected results in files with a predetermined format and a repairer, coupled to a plurality of the inspectors, retrieving the files stored by the inspectors and merging the files and executing repair processes as a batch at one time with reference to the merged files.

The integrated repair system further comprises a file server, coupled to a plurality of the inspectors through a network, for storing the files of the inspectors and providing the file when requested by the repairer, an automatic transfer device controlled by a host for automatically transferring the panels between a plurality of the inspectors and between the inspectors and the repairer and an automatic transfer device controller coupled to the host and receiving commands from the host and controlling transfers of the automatic transfer device.

The panels processed by this invention can be thin film transistor (TFT) panels.

The files include data on the coordinates of defects indicating the location of the defects on the panels; defect codes indicating the contents of the defects of the panels; and cell grades indicating the status of the defects on the panels.

The defect codes and the cell grades are merged with reference to coordinates of the defects written in files by a plurality of the inspectors, removing the duplicate parts of these files.

According to another aspect of the present invention, in a repair system comprising a plurality of inspectors that optically or electrically inspects panels where predetermined patterns have been formed and for stores results of the inspections in files with a predetermined format, and a repairer that repairs using the results of the inspections, a method for controlling the integrated repair system is provided, comprising the steps of: (a) forming predetermined patterns on the panels in each process; (b) inspecting optically or electrically the patterns formed on the panels after each process, and, storing the inspection results in a plurality of files with a predetermined format when defects are found on the panels; (c) merging the inspection results stored in the files and removing the duplicate parts; and (d) repair the defects on the panels as a group at once.

The above step (b) further comprises the step of inspecting electrically or optically the patterns on the panels, creating a file when the pixels are defective and storing the coordinates of the defects indicating the locations of the pixels, codes of the defects indicating the contents of the defects and the cell grades indicating defective status, and storing this file in a file server or on a hard disk installed in the inspector.

The above step (c) comprises the steps of first collecting the files through the network and determining whether or not each pixel on the panel is repairable from the defect data stored in the files, and then rejecting the pixel when it is not repairable and second determining whether to merge the files, and in case of merging, merging the files with reference to predetermined coordinates and removing duplicate data, and in case of not merging, connecting a predetermined inspector with a repairer. Then, the panel is repaired one by one with reference to the merged files or a file of a specified inspector.

The step (c) further comprises a step in which the data are merged into a file with reference to the coordinates of the defects for each file, and duplicate data are removed.

In other aspect of the present invention, a method for controlling an integrated repair system comprises the steps of (a) forming gate patterns on panels and optically or electrically inspecting the panels, (b) storing defect data associated with this step (a) in a first file, (c) forming active patterns on the panels and optically inspecting the panels, (d) storing defect data associated with this step (c) in a second file, (e) forming data patterns on the panels and optically or electrically inspecting the panels, (f) storing defect data associated with this step (e) in a third file, (g) forming pixel electrodes on the panels and optically or electrically inspecting the panels, (h) storing defect data associated with this step (g) in a fourth file, (i) forming a merged file by merging the first, second, third, and fourth files, and removing duplicate parts from the first, second, third, and fourth files, and (j) repairing the defects as a batch at once referring to the merged file.

In this present invention, automatic optical inspections are performed on the panels.

Additionally, an open/short tester is used to electrically inspect the panels in the above step (e), and an array tester is used to electrically inspect the panels in the above step (g).

The first through fourth files on defects have coordinates, codes, and cell grades of the defects located on the panels.

In other aspect of the present invention, an automatic defect detection system comprises a defect detector that inspects panels on which patterns have been formed by various manufacturing processes, and detects defects on the panels according to inspection results, and stores the defects in a file with a predetermined format, and a file server that receives the file of defects from the defect detector, and stores the defect data of the panels in a file format from the beginning of the execution of the processes up to the immediately prior process.

The automatic defect detection system further comprises a comparator, coupled to the file server, that compares the defect data of the panels collected up to the previous process with the defects of the panels of the current process stored in the file server.

The automatic defect detection system further comprises a panel ID reader reading the ID of the panel and transferring this data to the comparator. The comparator compares whether or not the panel ID read from the panel ID reader is identical to the in process panel ID stored in the file server.

The defect detector outputs the locations where the defects are located on the panel as coordinates of the defects.

The comparator compares whether the IDs of the panels stored in the file server are identical to the ID of a corresponding panel read from the panel ID reader, and if they are identical, compares data on the defects generated up to the immediate prior process with the defects detected by the inspector up to the current process, and then transfers to the file server the defective data of the current process (excluding the data on defects previously identified) and the data on defects generated up to the current process.

The file server stores IDs of the panels in each process, the data on defects up to current process received from the comparator, and the data on defects of the current process.

In other aspect of the present invention, a method for controlling an automatic defect detection system, comprises the steps of: (a) loading a panel after execution of each process; (b) detecting defects of the panel; (c) comparing the defects of the panel with the defect of the panels up to the immediate prior processes; and (d) storing the defect data of the current process and the defect data up to the immediate prior processes.

This method further comprises a step of reading an ID of the panel and comparing this ID with the IDs of the stored panels in the above steps (a) and (b).

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only a preferred embodiment of the invention has been shown and described, simply by way of illustrating the best mode contemplated by the inventor(s) of carrying out the invention. As will be realized, the invention can be modified in various obvious respects, all without departing from the invention. Accordingly, the drawings and description are to be regarded as illustrative in nature, and not restrictive.

Figure 4:
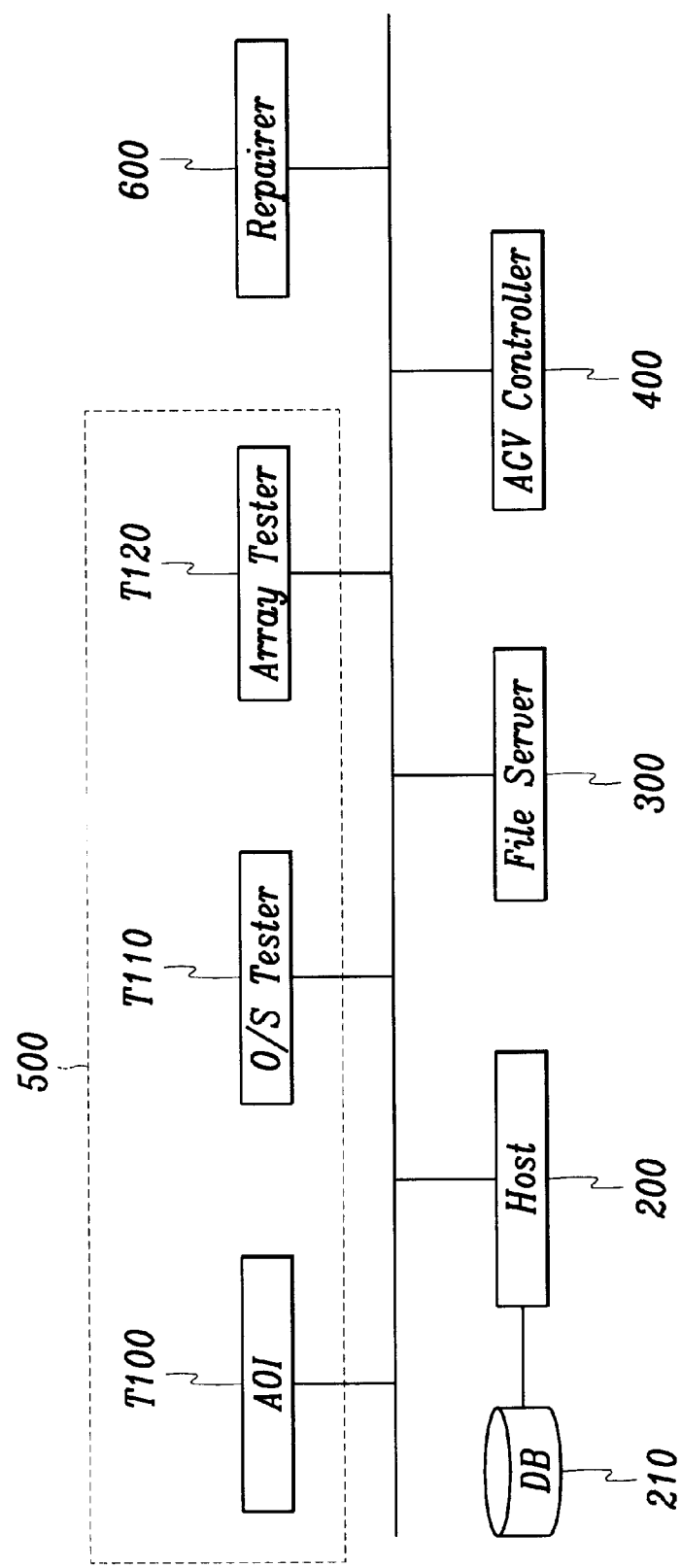
FIG. 4 is a schematic diagram of an integrated repair system according to an embodiment of the present invention.

FIG. 4 shows an integrated repair system according to an embodiment of the present invention. The integrated repair system, coupled to a network using the transmission control protocol/internet protocol (TCP/IP), comprises a plurality of inspectors 500, a repairer 600, a host 200 that manages the TFT-LCD manufacturing process, a database 210 coupled to the host 200, an automatic guide vehicle (AGV) controller 400 that controls an AGV and a file server 300 that allows the plurality of inspectors and repairer to share data. These inspectors 500 comprise an automatic optical inspector T100, an open/short tester T110, and an array tester T120.

The automatic optical inspector T100, the open/short tester T110, and the array tester T120 use a UNIX system as their operating system (OS), but other operating system can also be used. Files generated by the inspectors T100, T110, and T120 and repairer 600 can be stored on the file server 300 coupled to the network, or can be directly transferred from the respective inspectors T100, T110, and T120 to the repairer 600. Since the inspectors T100, T110, and T120 and the repairer 600 use a UNIX system as their OS in the embodiment of the present invention, file transfer methods supported by UNIX systems are employed.

Figure 5A:
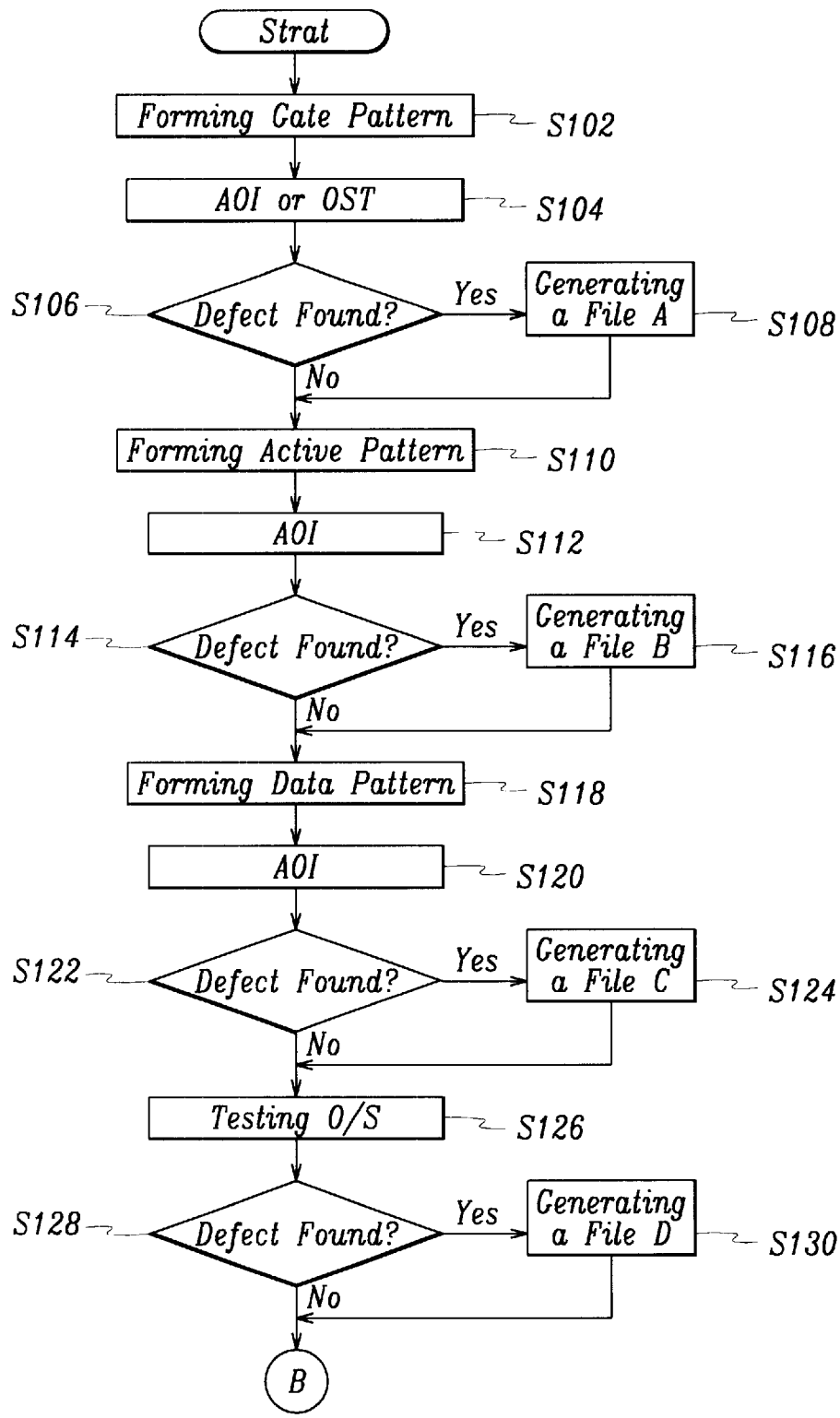
FIGS. 5 (a) and (b) are flow charts showing a TFT panel manufacturing process comprising the integrated repair system according to an embodiment of the present invention.
Figure 5B:
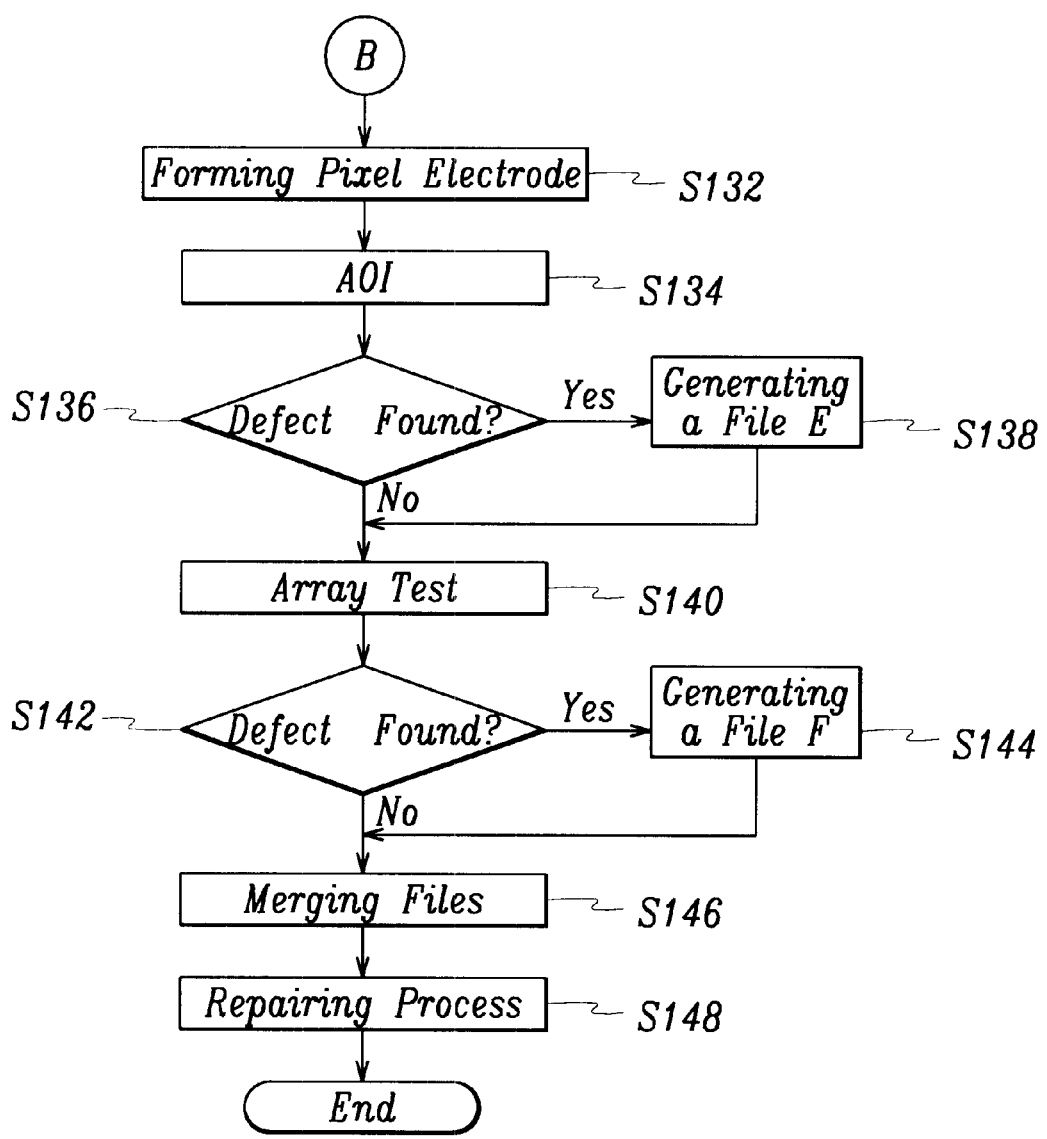

FIGS. 5 (a) and (b) are flow charts showing TFT panel manufacturing process comprising an integrated repair system according to an embodiment of the present invention.

When gate patterns are formed on the TFT panel (Step S102), the TFT panel is transferred to the automatic optical inspector or open/short tester (Step S104), and the gate patterns are examined for defects (Step S106). When defects are found, a file A is generated. The file A stores coordinates of defects, defect codes, and cell grades indicating the extent of the defects on the panel. The coordinates of the defects indicates pixels at which defects had been generated on the TFT panel, and are expressed with an X coordinate value and a Y coordinate value with respect to X and Y axes. The codes of the defects indicates items that each inspector can detect. For example, in case of AOI, the codes of the defects indicate film residues, film strips, particles, glass chips, corrosion, spots, photoresists, and mask defects. In case of OST, they indicate open or short circuit defects and, in case of array test, they indicate pixel or line defects.

The cell grades are expressed with the letters R, X, and O. The grade R indicates that the defective pixel on the TFT panel is repairable. The grade X indicates that the pixel is rejected, and hence, a TFT panel marked with X is not repaired. A normal pixel is marked with O. The file A generated in the automatic optical inspector can be stored in the file server connected to the network or can be stored on a hard disk installed in the automatic optical inspector (Step S108).

After the AOI or OST is performed on the TFT panel and the active pattern forming process is then executed on the TFT panel (Step S110), the TFT panel is again transferred to the automatic optical inspector and the TFT panel is inspected (Step S112 and S114) to generate a file B (Step S116). The file B, like the file A, is stored in the file server or on the hard disk in the automatic optical inspector.

After forming the data pattern (Step S118), the automatic optical inspector and open/short tester sequentially inspect the TFT panel (Step S120 through Step S130). In this process, files C and D are generated and respectively stored in the file server or on the hard disk in the inspector.

Finally, pixel electrodes are formed on the TFT panel (Step S132), and the automatic optical inspector and array tester perform an inspection on the TFT panel, and files E and F are then generated. (Steps S134 through S144).

The files A through F have coordinates of defects, defect codes, and cell grades generated from each inspection. These files are integrated before starting the repair process (Step S146).

Figure 6:
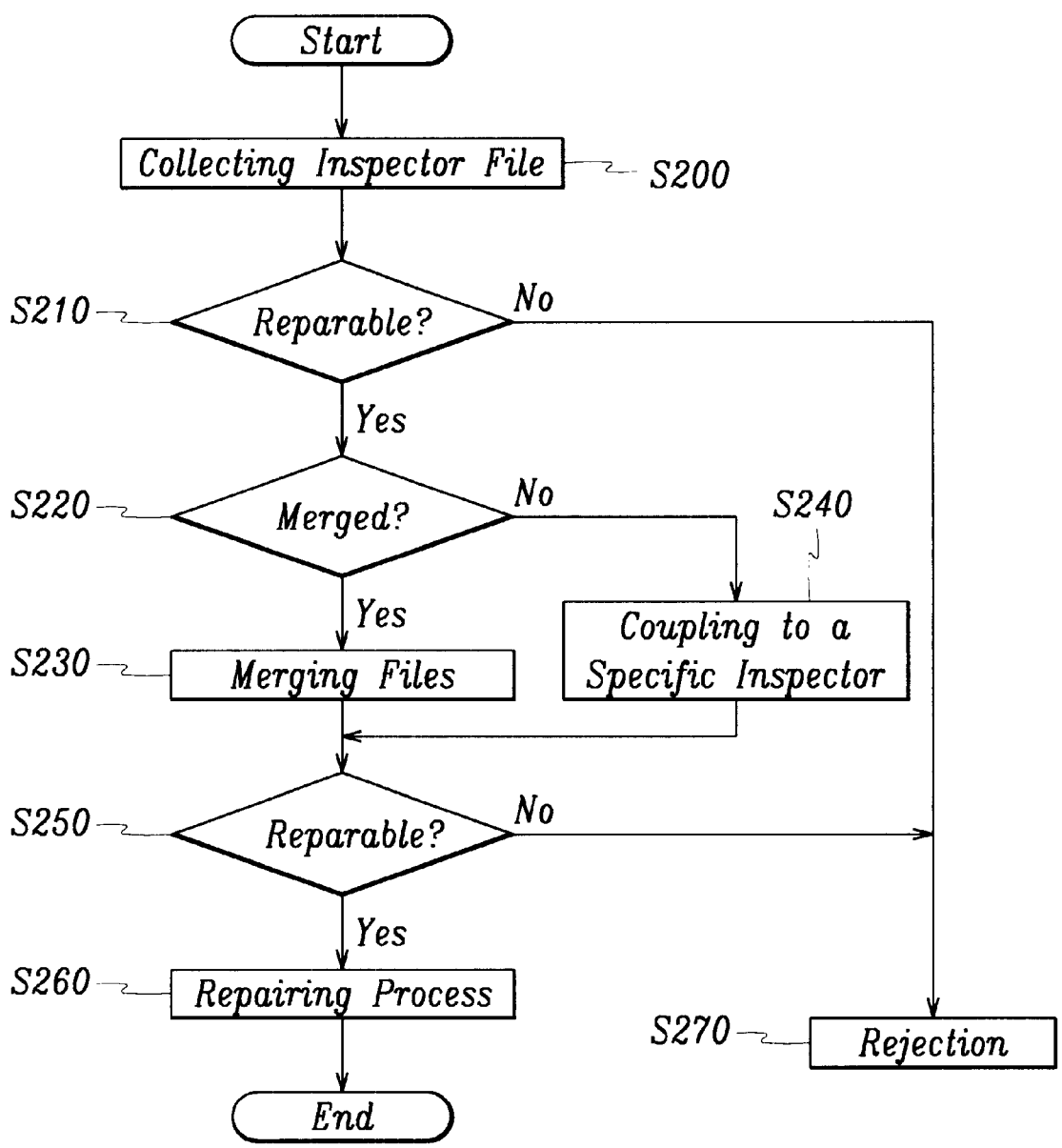
FIG. 6 is a flow chart of the file merging and repair steps in FIGS. 5 (a) and (b)

FIG. 6 is a flow chart of file merging and repair steps in FIGS. 5 (a) and (b).

A process as shown in FIG. 6 is performed before the repairer executes the repair process.

Files A through F generated from the automatic optical inspector, open/short tester, and array tester are collected. (Step S200). Two different methods can be used for this purpose.

First, if the respective files generated by the inspectors are commonly stored in the file server, the files are retrieved by contacting the file server.

Second, if the respective files generated from the inspectors are stored on the hard disk of an inspector, the files are retrieved by directly contacting the corresponding inspector.

The repairer refers to the cell grades of the collected files A through F and determines whether each cell is repairable. (Step S210). At this time, cells marked with X are rejected, and cells marked with O are not repaired because they do not have defects. (Step S270).

Next, it is determined if the collected files are to be merged. (Step S220). At this time, a flag is set to indicate whether or not to merge. When the flag is not set, the repairer directly contacts the appropriate inspector (Step S240). The repairer then refers to a file generated in this inspector and repairs the TFT panel.

However, when the flag is set, the files are merged as described below. For instance, in the file A generated from the automatic optical inspector after the gate pattern process, the coordinates of the defect could be (0,0), the defect code could indicate that the defect is photoresist, and the cell grade could be set as grade R. In the file B of this example generated from the automatic optical inspector after the active pattern process, the coordinates of the defect is set as (0,0), the defect code indicates that the defect is a mask, and the cell grade is set as grade R. Additionally, the file F generated from the array tester after the formation of pixel electrode in this same example could be coordinates of the defect set as (0,0), the defect code indicating that the defect is a pixel, and the cell grade set as grade R. In this case, the contents of the files A, B, and F are merged. The coordinates (0,0) of the file A is stored as the coordinates of the defect. Photoresist and mask defects from the automatic optical inspector, and the pixel defect from the array tester are stored as the codes of defects. Grade R is stored as the cell grade. The coordinates of the defects (0,0) in the files B and F are removed. Using thisexemplary method, the contents written on a plurality of files are merged without duplicating data on coordinates of the defects (Step S230).

In the repair process, the repair refers to the cell grade in the merged files to determine whether it is repairable (Step S250). When the cell grade is R, it is repaired. When repaired, the cell grade is switched to grade O.Otherwise, the cell grade is switched to grade X. (Step S260).

Figure 7:
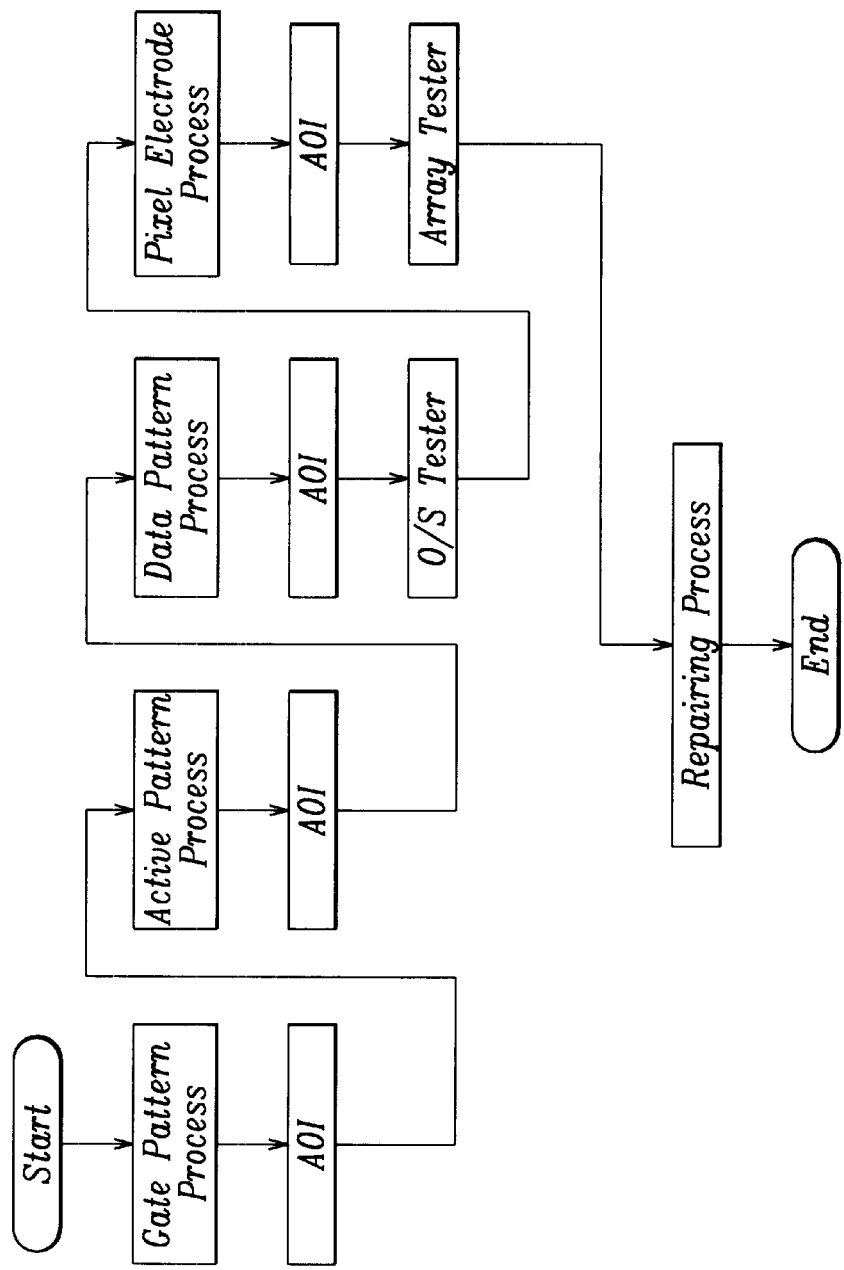
FIG. 7 is a process line configuration diagram for the handling of a TFT panel in the manufacturing process of FIGS. 5 (a) and (b)

FIG. 7 is a process line configuration diagram for handling a TFT panel in the manufacturing process of FIG. 5.

Figure 1A:
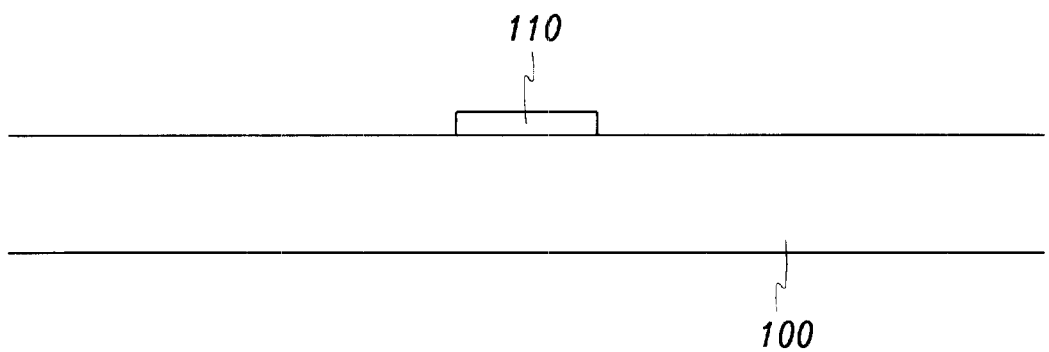
FIGS. 1 (a) through (f) illustrate a manufacturing process of a TFT panel.
Figure 1B:
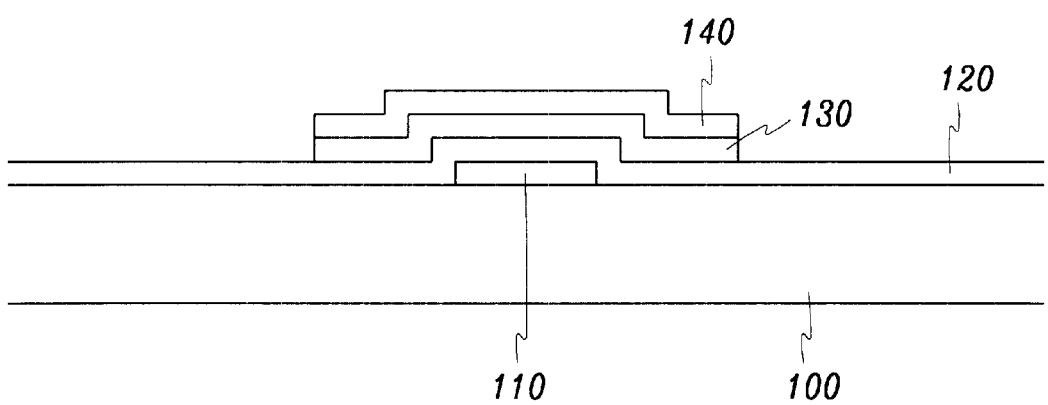
Figure 1C:
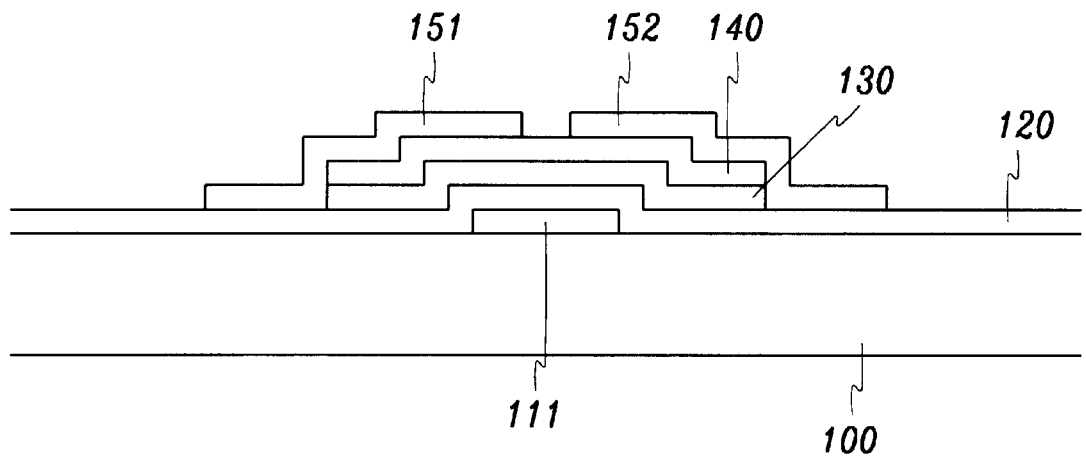
Figure 1D:
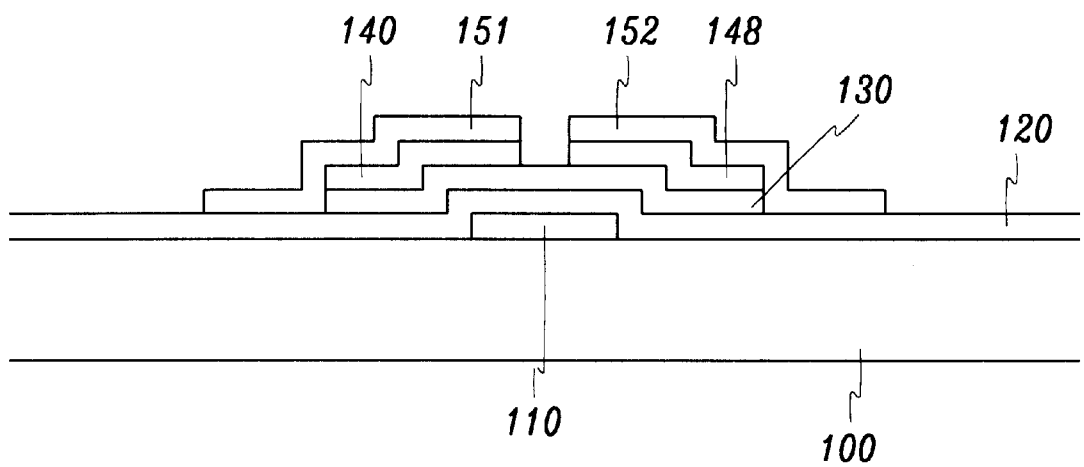
Figure 1E:
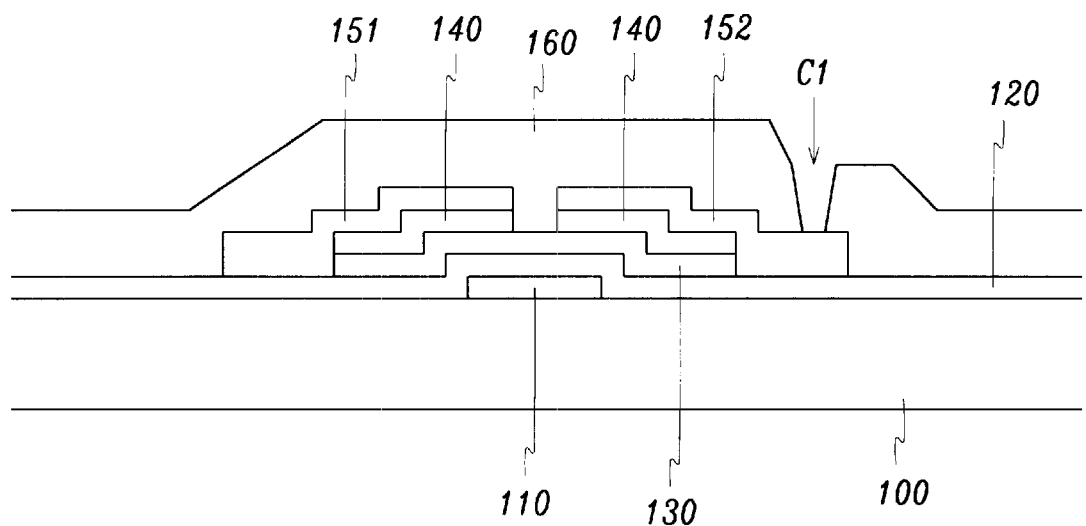
Figure 1F:
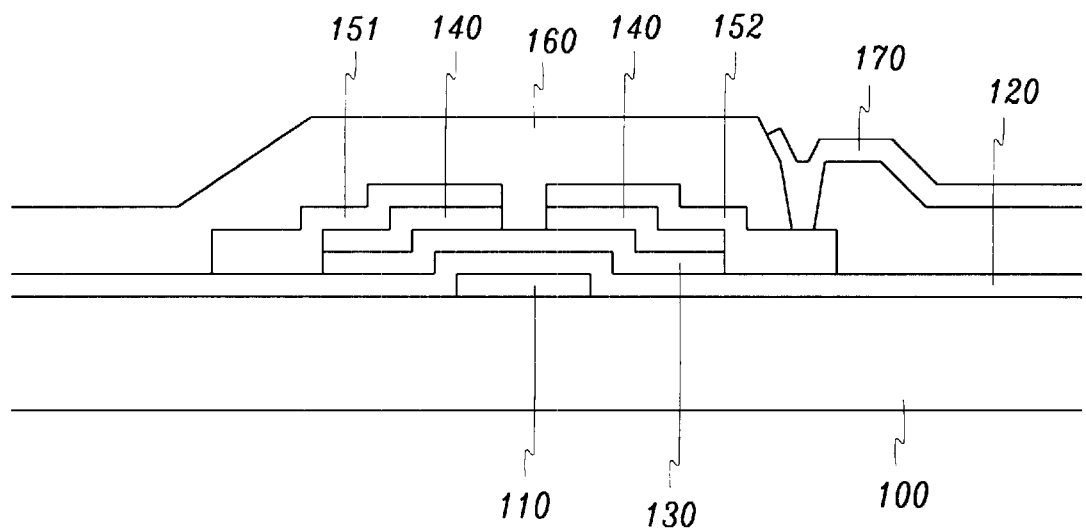
Figure 2A:
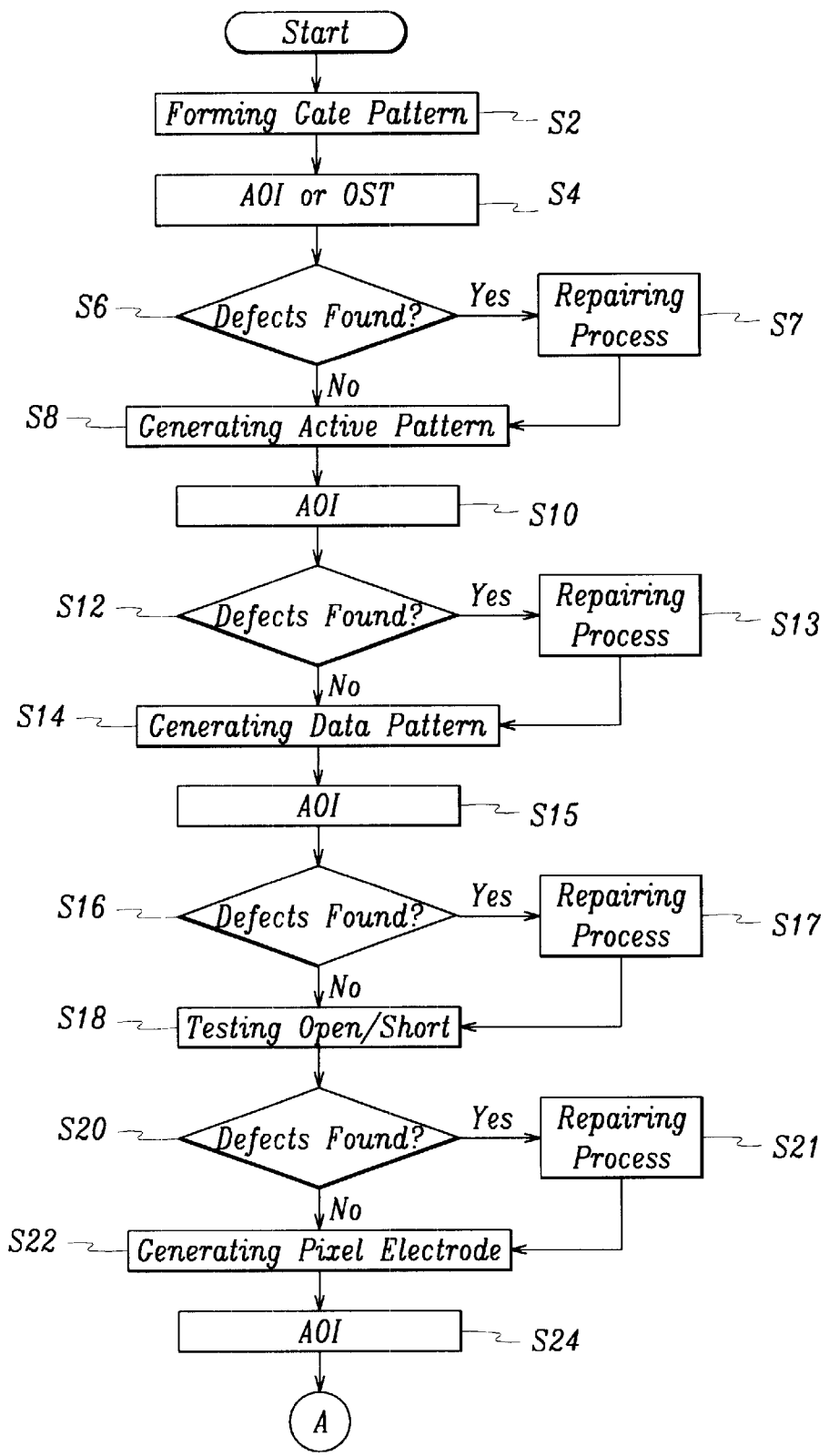
FIGS. 2 (a) and (b) are flow charts of a conventional manufacturing process as shown in FIGS. 1 (a) through (f)
Figure 2B:
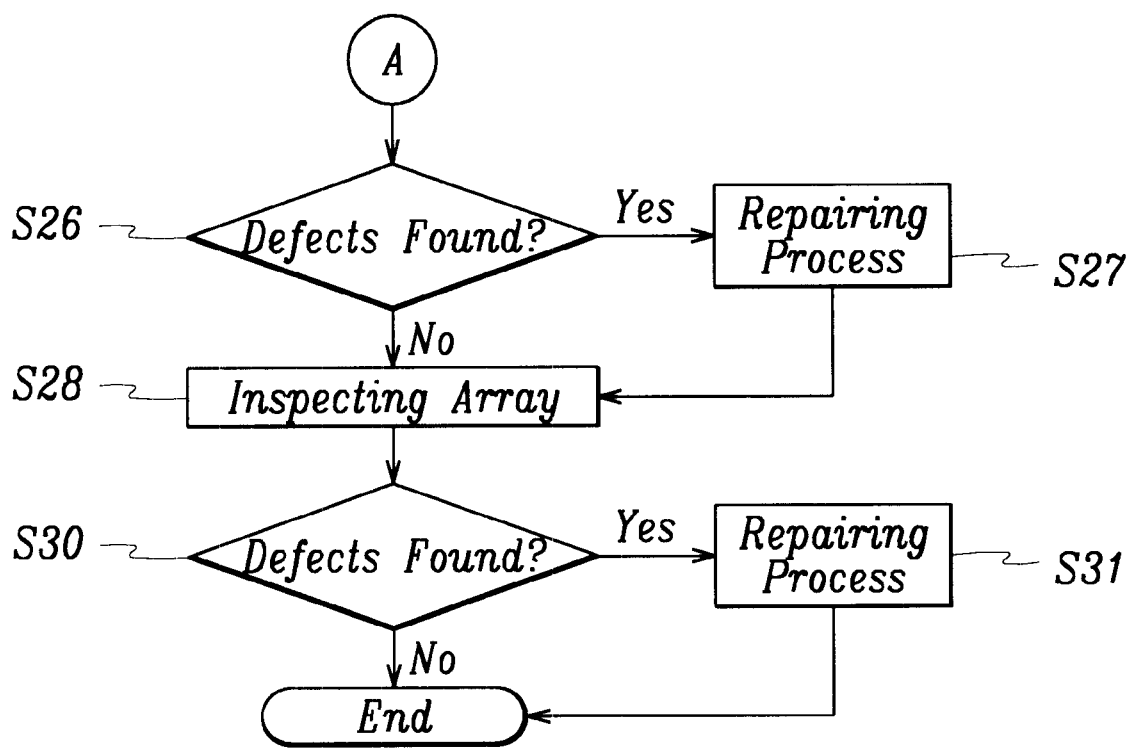
Figure 3:
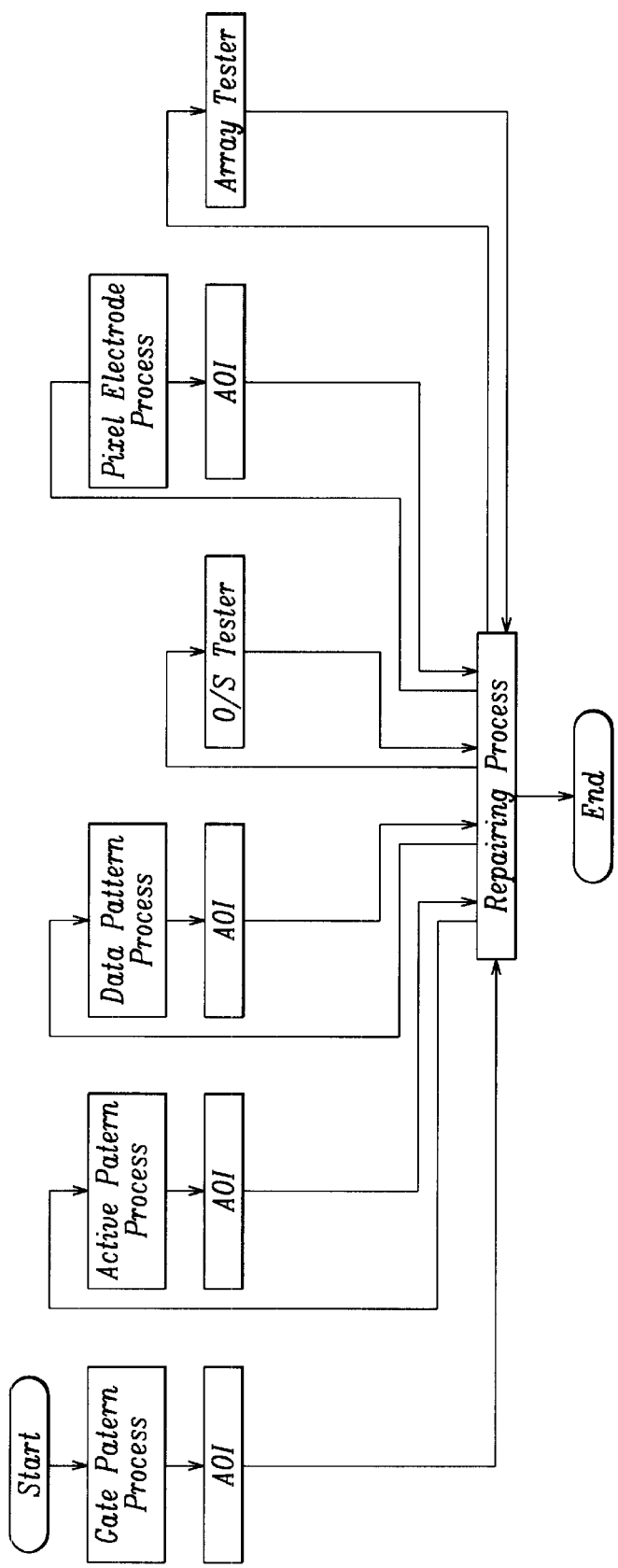
FIG. 3 is a process line diagram for handling a TFT panel in the manufacturing process represented in FIGS. 2 (a) and (b)

The TFT panel is sequentially transferred to each manufacturing and inspection process and then finally to the repair process. Therefore, compared with FIG. 3, the process of frequently transferring the panel from an inspector to the repairer by an AGV is omitted.

In the above integrated repair system, each inspector must detect defective data generated in each process. However, since an TFT-LCD panel undergoing a plurality of processes has defects accumulated as it passes through each process, a defect detection system to detect such defects generated in the above noted processes is required. Such a system will now be described.

Figure 8:
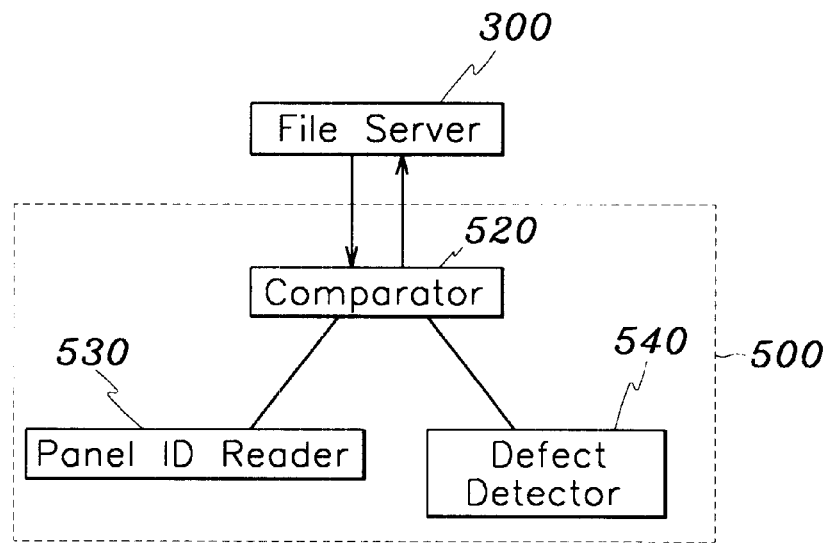
FIG. 8 is a block diagram of a defect detection system according to an embodiment of the present invention.

FIG. 8 shows an automatic defect detection system according to an embodiment of the present invention.

The automatic defect detection system comprises a file server 300 and an inspector 500. The inspector 500 comprises a comparator 520, a panel ID reader 530, and a defect detecting device 540.

The panel ID reader 530 reads the ID of the panel being processed, and transfers the read results to the comparator 520, and the defect detecting device 540 detects the defects of this panel and transfers the results to the file server 300 through the comparator 520. The comparator 520 compares the accumulated defect data collected from the previous process and provided through the file server 300 with the accumulated defect data of the current process detected through the defect detecting device 540, and produces defect data of the current process.

Figure 9:
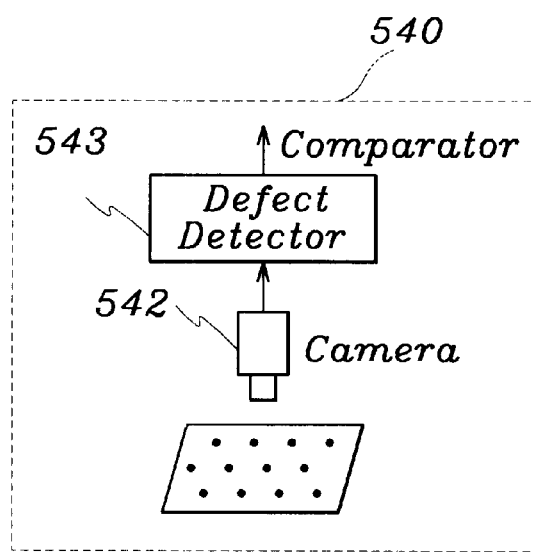
FIG. 9 is a schematic diagram of the defect detection system of FIG. 8.

FIG. 9 is a schematic diagram of the defect detecting device 540. The defect detector 540 comprises a camera 542 and a defect detector 543. The camera 542 takes a photograph of the panel, and the defect detector 543 sorts the defects on the panel collected by the camera 542, and transfers this information to the comparator 520.

Figure 10:
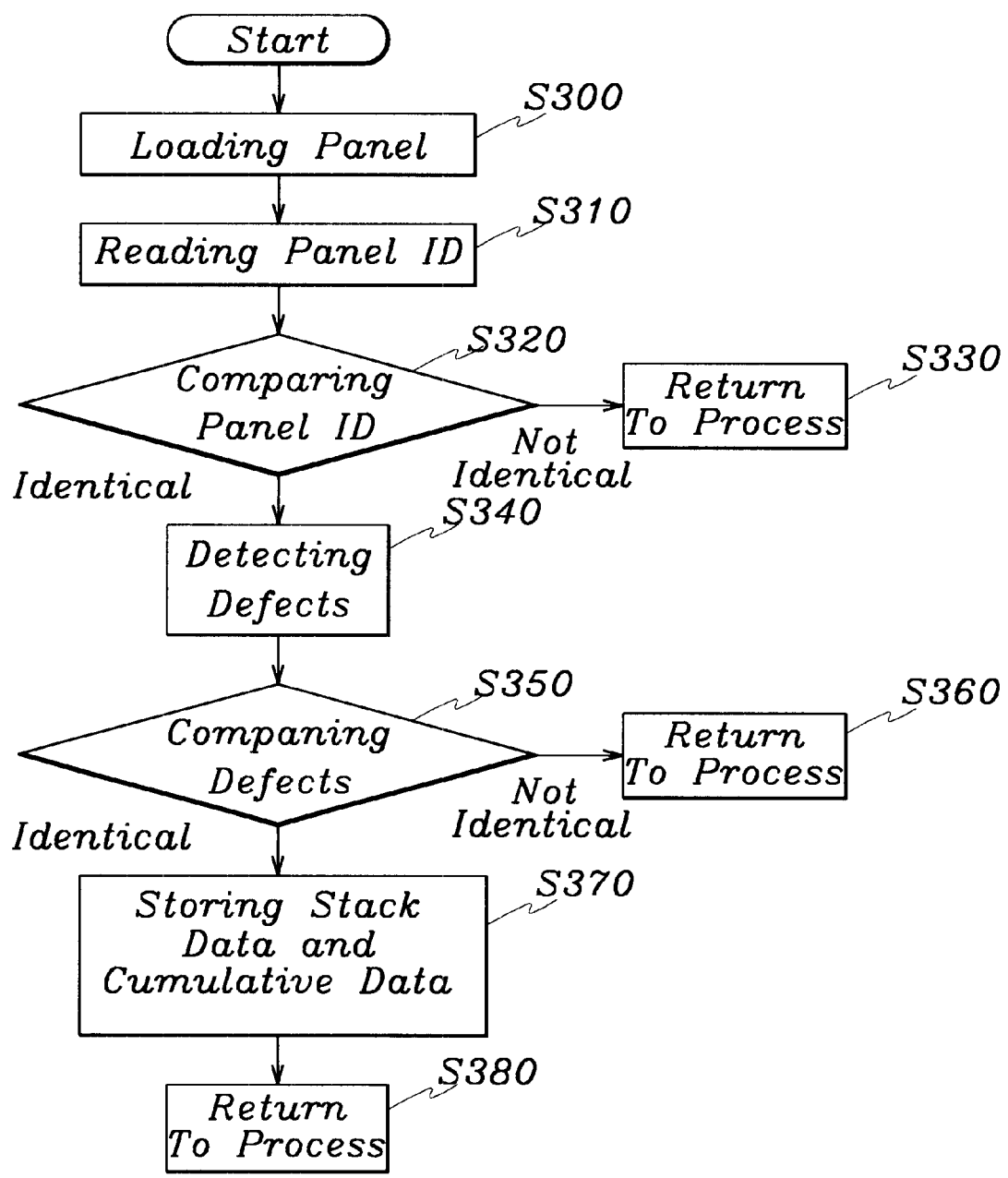
FIG. 10 is an operation flow chart of the defect detection system according to an embodiment of the present invention.

Referring to FIGS. 8 through 10, a preferred embodiment of the present invention will be described. The automatic defect detection system according to the present invention detects the defects on a panel after each of the LCD manufacturing processe is finished.

First, the panels that went through a process are loaded onto the panel ID reader 540 (Step S300). The panel ID reader 540 reads the IDs of the panels and transfers the IDs of the panels to the comparator (Step S310).

The comparator 520 compares the ID of the panel transferred from the panel ID reader with the IDs of the panels undergoing the current process. The file server 300 stores the IDs of the panels provided in the current process.

If the comparator 520 cannot match the ID of the panel with the ID of a panel undergoing the current process, the panel is then transferred to the next process (Step 330). If the IDs are matched, the defect detection procedure starts. (Step S340) That is, when the ID of the panel read by the panel ID reader 530 is identical to the ID of a panel stored in the file server 300 undergoing the current process, the camera 542 takes a photograph of defects on the panel, and transfers this information on detected defects to the defect detector 543. The defect detector 543 sorts the defect data transferred from the camera 542, and transfers the data to the comparator 520. These data are cumulative data since all the defects generated up to the current process are detected in the image photographed by the camera 542. The data comprise information on the location, the contents, and the status of the defects.

The comparator 520 retrieves data on defects stored in the file server, regarding the panel. At this time, the data on the defects are cumulative from the beginning up to the immediate prior process. The comparator 520 compares the cumulative data retrieved from the server with the data collected in the current process that has been transferred from the defect detector 542. If no difference is found after this comparison, the current panel is transferred to a next process (Step S360). If any difference is found, an appropriate change is made to the data, which is now referred to as stack data.

Figure 11A:
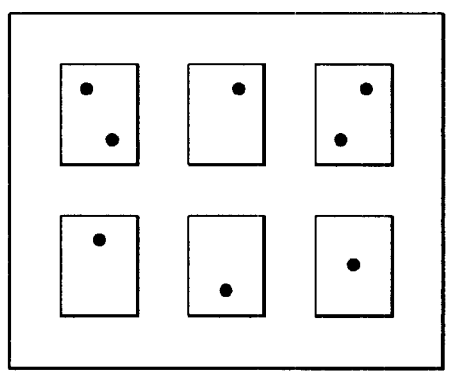
FIGS. 11 (a) through (c) are drawings illustrating examples of defects on a panel.
Figure 11B:
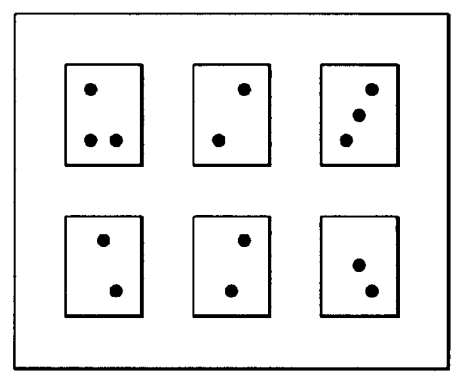
Figure 11C:
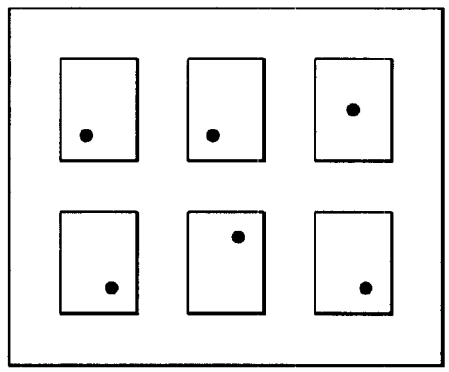

FIGS. 11 (a) through (c) are drawings illustrating defective panels. FIG. 11 (a) illustrates an example of defects up to the immediate prior process stored in the file server, and FIG. 11 (b) illustrates an example of defects detected in the current process. The defects generated in the current process are represented in FIG. 11 (c), which is a representation of the difference between FIGS. 11 (a) and (b). The data of FIG. 11 (c) is the stack data.

The stack data and cumulative data are transferred to the file server and stored (Step S370). This stack data provide accurate information about the defective panel being processed.

When the above process is finished, the panel returns to a next process. (Step S380).

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An integrated repair system of micro electronic devices, comprising:
   a plurality of inspectors that optically or electrically inspects panels on which predetermined patterns are formed and stores the results of these inspections in files with a predetermined format; and
   a repairer coupled to a plurality of the inspectors, that collects and mergers the files stored by the inspectors and repairs as a batch at once with reference to the merged files.

2. The system of claim 1, further comprising a file server coupled to a plurality of the inspectors through a network, that stores the files of the inspectors and provides the file when requested by the repairer.

3. The system of claim 1, further comprising an automatic transfer device, that automatically transfers the panels between a plurality of the inspectors and between the inspectors and the repairer controlled by a host.

4. The system of claim 3, further comprising an automatic transfer device controller coupled to the host, that receives commands from the host and controls the automatic transfer device.

5. The system of claim 1, wherein the panels are thin film transistor (TFT) panels.

6. The system of claim 1, wherein the files comprise:
   coordinates of defects indicating locations of the defects on the panels;
   codes of the contents of the defects on the panels; and
   cell grades indicating the status of the defects on the panels.

7. The system of claim 6, wherein files are merged with reference to the duplicate coordinates of the defects, and the redundant data of the files are removed.

8. A method for controlling an integrated repair system, said repair system comprising a plurality of inspectors that optically or electrically inspects panels on which predetermined patterns are formed, and stores the inspection results in files with a predetermined format, and a repairer that repairs defects using the inspection results, comprising the steps of:
   (a) forming predetermined patterns on the panels in each process;
   (b) inspecting optically or electrically the patterns after each process and storing the inspection results in a plurality of files with a predetermined format when defects are generated on the panels,;
   (c) merging the inspection results stored in the files and removing the duplicate parts; and
   (d) repairing the defects as a batch at once.

9. The method of claim 8, wherein the step (b) further comprises the steps of:
   storing coordinates of the defects indicating the locations of the pixels, codes of the defects indicating the contents of the defects, and cell grades indicating defective status, when the pixels are defective; and
   storing the file in a file server or on hard disks in the inspectors.

10. The method of claim 8, wherein the step (c) comprises the steps of:
    collecting the files through the network;
    determining whether or not each pixel on the panel is repairable among the data on defects stored in the files, and rejecting a pixel when not repairable;
    determining whether to merge the files, and in the case of merging, merging the files with reference to predetermined coordinates and removing duplicate data, and in the case of not merging, connecting a repairer one by one with a predetermined inspector.

11. The method of claim 10, wherein the step (c) further comprises a step of removing the duplicate data merged into a file with reference to the coordinates of the defects.

12. A method for controlling an integrated repair system, comprising the steps of:
    (a) forming a gate pattern on a panel and inspecting the panels optically or electrically;
    (b) storing data related to a first set of defects in a first file when the first set of defects are found in step (a);
    (c) forming an active pattern on the panel and inspecting the panels optically;
    (d) storing data related to a second set of defects in a second file when the second set of defects are found in step (c);
    (e) forming a data pattern on the panel and inspecting the panel optically or electrically;
    (f) storing data related to a third set of defects in a third file when the third set of defects are found in step (e);
    (g) forming a pixel electrode on the panel and inspecting the panel optically or electrically;
    (h) storing data related to a fourth set of defects in a fourth file when the fourth set of defects are generated in step (g);
    (i) merging the first, second, third, and fourth files, and removing the duplicate parts from the first, second, third, and fourth files; and
    (j) repairing the defects at one time referring to the merged file.

13. The method of claim 12, wherein automatic optical inspections are executed on the panels.

14. The method of claim 12, wherein an open/short tester is used to electrically inspect the panels in the step (e).

15. The method of claim 12, wherein an array tester is used to electrically inspect the panels in the step (g).

16. The method of claim 12, wherein the data related to all the sets of defects have coordinates, codes, and cell grades of the defects found on the panels.

17. An automatic defect detection system, comprising:
    a defect detector that inspects a panel, detects a defect on the panel according to inspection results, and stores defect data in a file with a predetermined format; and
    a file server that receives the defect data file from the defect detector, and stores the data on the panel defect incurred by each process up to the immediate corresponding process in a file format, wherein the automatic defect detection system further comprises a comparator coupled to the file server, that compares the defects of the panels generated in the previous processes stored in the file server with the defects of the panels generated in the current process.

18. The system of claim 17, wherein the automatic defect detection system further comprises a panel ID reader for reading the ID of the panel and transferring the read result to the comparator.

19. The system of claim 18, wherein the comparator determines whether or not the panel ID read from the panel ID reader is identical to a panel ID stored in the file server undergoing the corresponding process.

20. An automatic defect detection system, comprising:

a defect detector that inspects a panel, detects a defect on the panel according to inspection results, and stores defect data in a file with a predetermined format; and a file server that receives the defect data file from the defect detector, and stores the data on the panel defect incurred by each process up to the immediate corresponding process in a file format, wherein the defect detector outputs data on the locations of the defects on the panel as coordinates of the defects.

21. The system of claim 19, wherein the comparator determines whether one of the IDs of the panels stored in the file server is identical to the ID of the current panel read by the panel ID reader, and when they are identical, compares the cumulative defect data up to the immediate prior process with the defects detected by the inspector up to the current process, and transfers the defect data of the current process excluding the defect data previously identified, and also transfers the defect data generated up to the current process to the file server.

22. The system of claim 21, wherein the file server stores IDs of the panels in each process, the defect data received from the comparator up to current process, and the defect data of the current process.

23. A method for controlling an automatic defect detection system, comprising the steps of:

(a) loading a panel after execution of each process;

(b) detecting defects of the panel;

(c) comparing the defects of the panel with the defect of the panels generated up to the immediate prior process; and (d) storing the defect data of the current process and the defect data up to the immediate prior process.

24. The method of claim 23, wherein the method further comprises a step of reading an ID of the panel and comparing this ID with the stored panel IDs between steps (a) and (b).

25. A method for manufacturing a liquid crystal display apparatus, by using an integrated repair system, said repair system comprising a plurality of inspectors that optically or electrically inspects thin film transistor (TFT) panels on which predetermined patterns and pixels are formed, and stores the inspection results in files with a predetermined format, and a repairer that repairs defects using the inspection results, comprising the steps of:

(a) forming predetermined patterns on the panels in each process;

(b) inspecting optically or electrically the patterns after each process, and storing the inspection results in a plurality of files with a predetermined format when defects are generated on the TFT panels;

(c) merging the inspection results stored in the files and removing the duplicate parts; and (d) repairing the defects as a batch at once.

26. The method of claim 25, wherein the step (b) further comprises the steps of:

storing coordinates of the defects indicating the locations of the pixels, codes of the defects indicating the contents of the defects, and cell grades indicating defective status, when the pixels are defective; and storing the file in a file server or on hard disks in the inspectors.

27. The method of claim 25, wherein the step (c) comprises the steps of:

collecting the files through the network;

determining whether or not each pixel on the TFT panel is repairable among the data on defects stored in the files, and rejecting a pixel when not repairable;

determining whether to merge the files, and in the case of merging, merging the files with reference to predetermined coordinates and removing duplicate data, and in the case of not merging, connecting a repairer one by one with a predetermined inspector.

28. The method of claim 27, wherein the step (c) further comprises a step of removing the duplicate data merged into a file with reference to the coordinates of the defects.

* * * * *